United States Patent
Huang et al.

(10) Patent No.: US 9,844,012 B2
(45) Date of Patent: Dec. 12, 2017

(54) AUTOMATIC GAIN CONTROL GAIN ADJUSTMENT

(71) Applicant: Intel IP Corporation, Santa Clara, CA (US)

(72) Inventors: Rui Huang, Beijing (CN); Yang Tang, Pleasanton, CA (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/186,663

(22) Filed: Jun. 20, 2016

(65) Prior Publication Data

US 2017/0048808 A1   Feb. 16, 2017

Related U.S. Application Data

(60) Provisional application No. 62/204,678, filed on Aug. 13, 2015.

(51) Int. Cl.
*H04W 52/52* (2009.01)
*H04W 74/08* (2009.01)
*H03G 3/30* (2006.01)

(52) U.S. Cl.
CPC .......... *H04W 52/52* (2013.01); *H03G 3/3078* (2013.01); *H04W 74/0808* (2013.01)

(58) Field of Classification Search
CPC ............... H04W 16/14; H04W 72/042; H04W 74/0808; H04W 52/52
See application file for complete search history.

(56) References Cited

U.S. PATENT DOCUMENTS

| | | | | |
|---|---|---|---|---|
| 2013/0114519 A1* | 5/2013 | Gaal | .................... | H03G 3/3078 370/329 |
| 2013/0315152 A1* | 11/2013 | Ratasuk | .............. | H04W 76/023 370/329 |
| 2014/0133337 A1* | 5/2014 | Lee | ..................... | H04W 52/325 370/252 |
| 2015/0327180 A1* | 11/2015 | Ryu | ......................... | H04L 1/00 370/329 |
| 2015/0327233 A1* | 11/2015 | Liu | ................... | H04W 56/0015 370/329 |

(Continued)

OTHER PUBLICATIONS

Ericsson, "On RRM Measurements and Reporting for LAA", 3GPP TSG RAN WG1 Ad-hoc on LAA, Paris, France, Mar. 24-26, 2015.

(Continued)

*Primary Examiner* — Bobbak Safaipour
(74) *Attorney, Agent, or Firm* — Schiff Hardin LLP

(57) ABSTRACT

A method of Automatic Gain Control (AGC) gain adjustment by a wireless device, including receiving a reference signal and data from a secondary cell operating in unlicensed spectrum; and adjusting the AGC gain for the secondary cell based on the reference signal, which is received in a same measurement timing configuration period as the data. Further, a method of AGC gain adjustment including receiving a primary reference signal from a primary cell operating in licensed spectrum; and adjusting the AGC gain for a secondary cell operating in unlicensed spectrum based on the primary reference signal and at least one of a transmission power difference, a reception power difference, and a propagation path loss difference between the primary cell and the secondary cell.

16 Claims, 3 Drawing Sheets

(56) References Cited

U.S. PATENT DOCUMENTS

| | | | |
|---|---|---|---|
| 2016/0043843 A1* | 2/2016 | Liu | H04L 5/0048 370/329 |
| 2016/0135143 A1* | 5/2016 | Won | H04W 72/005 370/312 |
| 2016/0234706 A1* | 8/2016 | Liu | H04L 27/2662 |
| 2016/0255577 A1* | 9/2016 | Kazmi | H04W 52/0206 370/311 |
| 2016/0302230 A1* | 10/2016 | Novlan | H04B 17/318 |
| 2016/0330676 A1* | 11/2016 | Thangarasa | H04W 48/20 |
| 2017/0048884 A1* | 2/2017 | Jung | H04L 5/001 |

OTHER PUBLICATIONS

ETRI, "Preamble field for time-aligned load based equipment type LBT mechanism", 3GPP TSG-RAN1 #79, San Francisco, USA Nov. 17-Nov. 21, 2014.

Communication with Partial Search Report dated Jan. 3, 2017 for European Patent Application No. 16179358.3.

* cited by examiner

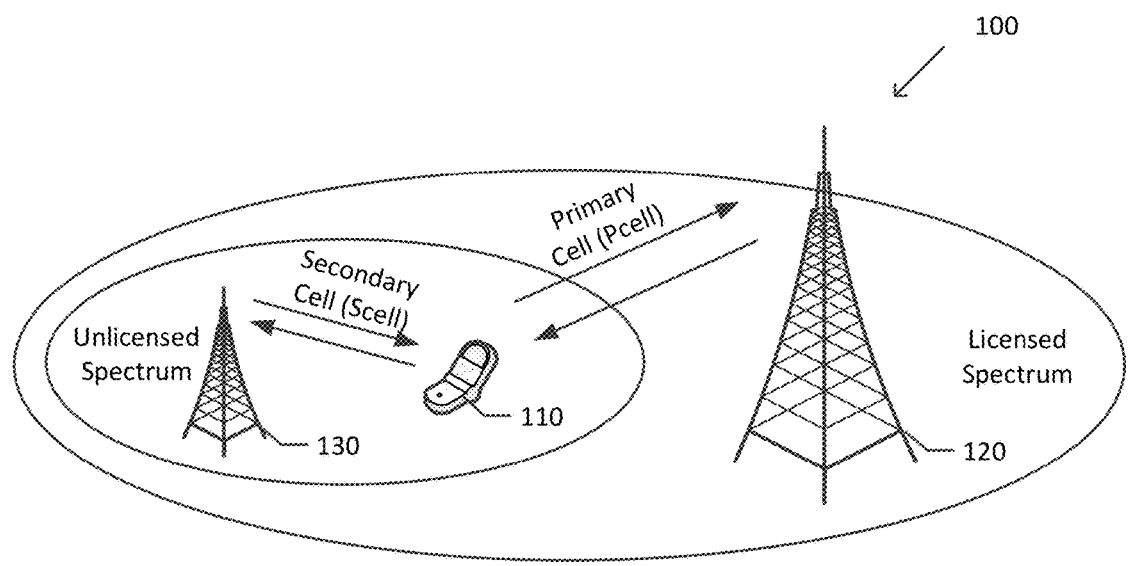
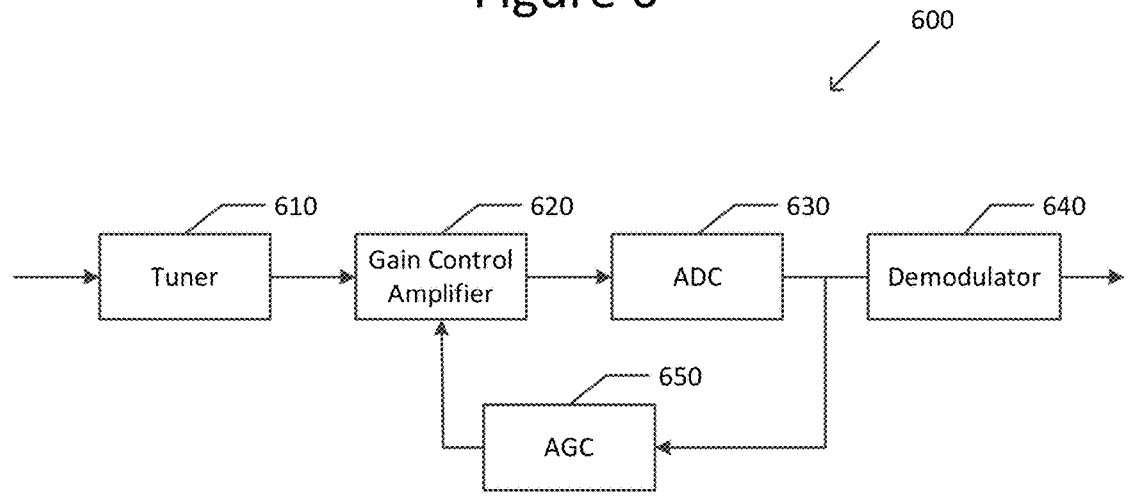

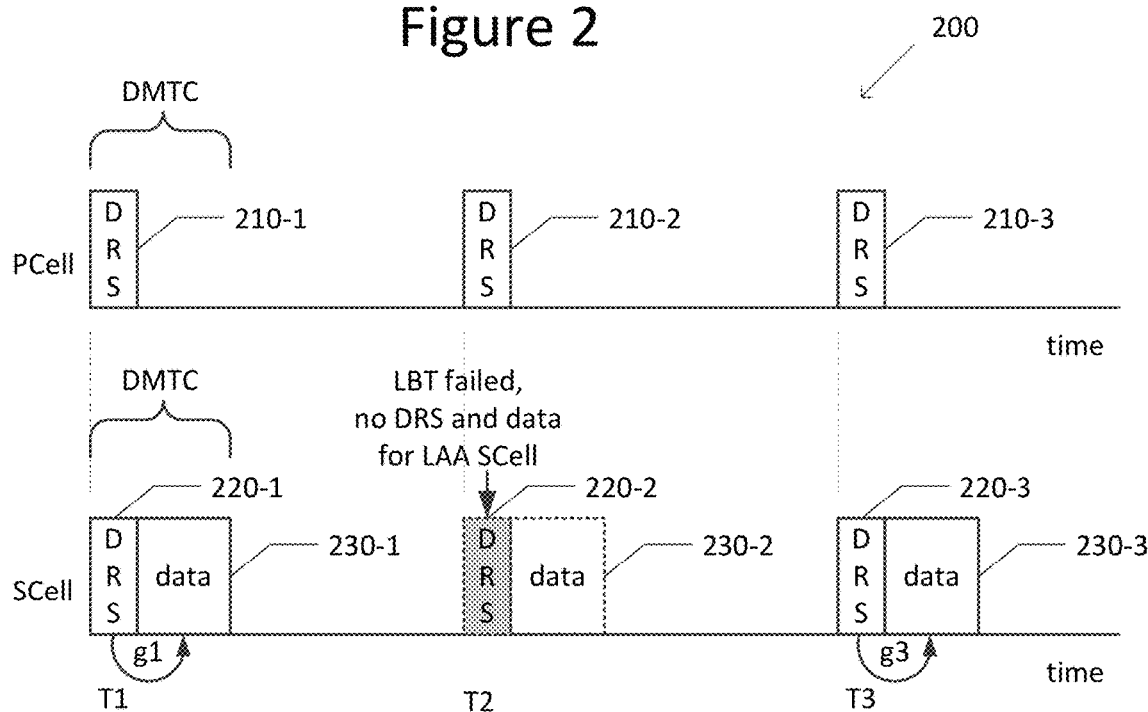
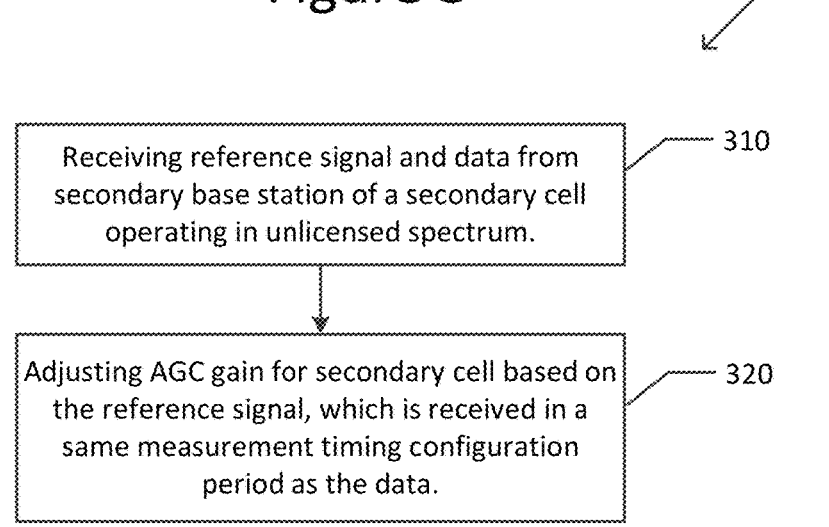

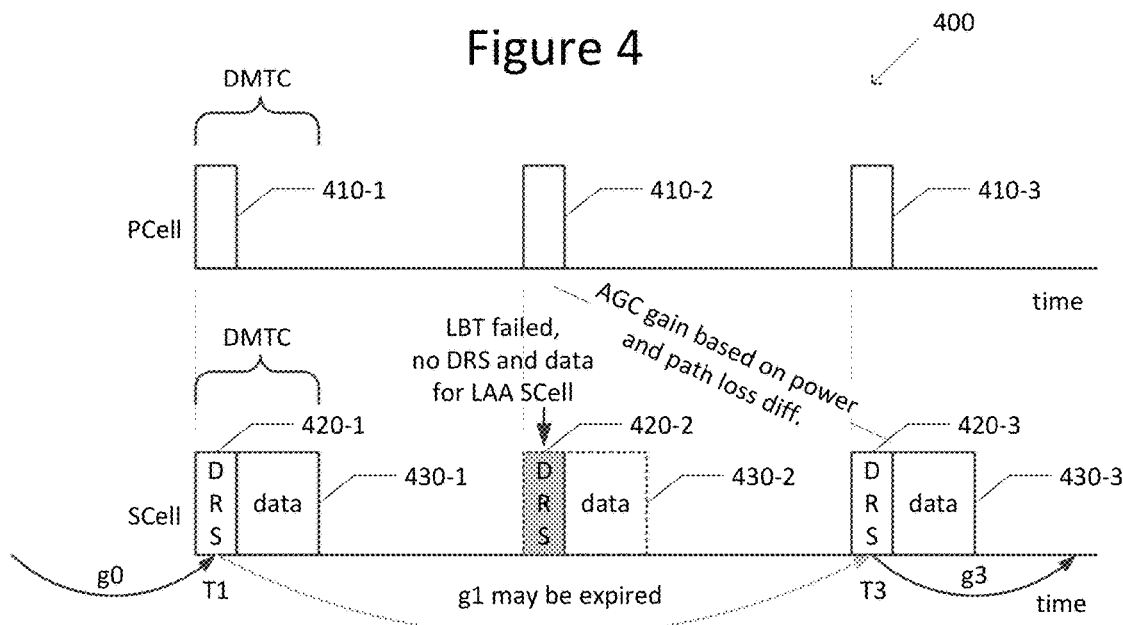
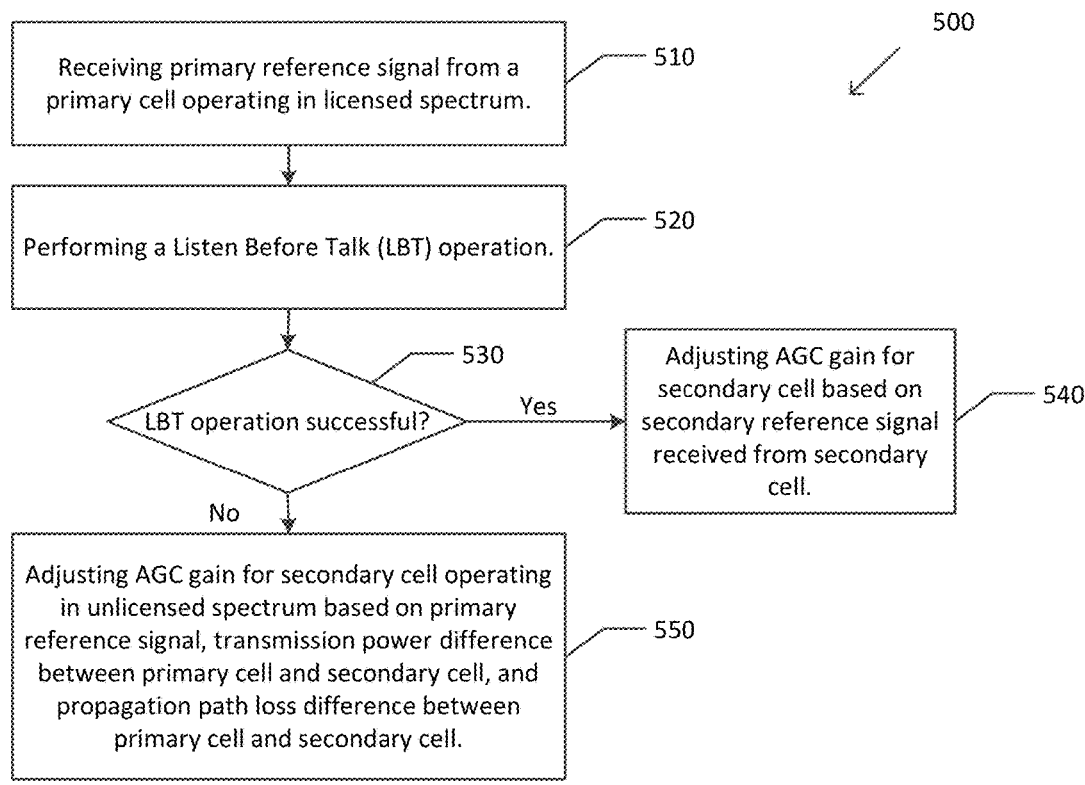

AUTOMATIC GAIN CONTROL GAIN ADJUSTMENT

TECHNICAL FIELD

The present disclosure generally relates to Automatic Gain Control (AGC) gain adjustment, and more specifically, to AGC gain adjustment in License Assisted Access (LAA) secondary cells.

BACKGROUND

Long Term Evolution (LTE) uses Licensed Assisted Access (LAA) to perform carrier aggregation between a primary cell (PCell) and one or more lower power, secondary cells (SCells). The PCell operates in licensed spectrum, whereas with LAA the SCells operate in unlicensed spectrum for offloading in order to improve throughput.

Discovery Reference Signals (DRS) improve a wireless device's discovery of different cells in heterogeneous networks. The wireless device adjusts the AGC gain for SCells based on a DRS received in the prior DRS Measurement Timing Configuration (DMTC) as compared with data. Prior to transmission, a wireless device or a secondary cell performs a Listen Before Talk (LBT) procedure to ensure that the unlicensed spectrum is not already occupied. If the unlicensed spectrum is occupied, discontinuous transmission on the SCells makes it infeasible to guarantee successful DRS transmission for AGC gain adjustment at every DRS occasion. As a result, if there is an LBT failure, meaning the unlicensed channel is occupied, more than one DRS period (e.g., 40 ms, 80 ms, 160 ms . . . ) is needed for an AGC gain adjustment.

BRIEF DESCRIPTION OF THE DRAWINGS

FIG. 1 illustrates a schematic diagram of a wireless communication system in accordance with an aspect of the disclosure.

FIG. 2 illustrates a signaling diagram in accordance with an aspect of the disclosure.

FIG. 3 illustrates a flowchart of a method in accordance with the signaling diagram of FIG. 2.

FIG. 4 illustrates a signaling diagram in accordance with another aspect of the disclosure.

FIG. 5 illustrates a flowchart of a method in accordance with the signaling diagram of FIG. 4.

FIG. 6 illustrates a schematic diagram of a portion of a receiver of a wireless device.

DESCRIPTION OF THE ASPECTS

The present disclosure is directed to Automatic Gain Control (AGC) gain adjustment in License Assisted Access (LAA) secondary cells (SCells). If a signal from an SCell is not received, the AGC gain adjustment may be based on a reference signal, which is received from an SCell in a same measurement timing configuration period as data. If a signal from an SCell is received, the AGC gain adjustment may be based on a reference signal, which is transmitted on a primary cell (PCell), and at least one of a transmission power difference, a reception power difference, and a propagation path loss difference between the primary cell and the secondary cell.

FIG. 1 illustrates a schematic diagram of a wireless communication system 100 in accordance with an aspect of the disclosure.

The wireless communication system 100 is an LTE system comprising a wireless device 110, a primary base station 120, and a secondary base station 130. The wireless device 110 may be referred to as a User Equipment. The primary base station 120 is a wireless communications station installed at a fixed location, operating within a primary cell (PCell) and used to communicate in licensed spectrum. The secondary base station 130 is a lower power, wireless communications station installed at a fixed location, operating within a secondary cell (SCell) and, in the case of LAA, used to communicate in unlicensed spectrum. LAA performs carrier aggregation between the PCell and one or more SCells in order to improve throughput.

FIG. 2 illustrates a signaling diagram 200 in accordance with an aspect of the disclosure. PCell signaling versus time is shown in the top portion of FIG. 2, and SCell signaling versus time is shown in the bottom portion.

The primary base station 120 of the PCell transmits DRS signals 210, which comprises Primary Synchronization Signal (PSS), Secondary Synchronization Signal (SSS), and Common Reference Signal (CRS) every DRS Measurement Timing Configuration (DMTC). The secondary base station 130 of the SCell transmits a DRS 220 and data 230 every DMTC; the first subframe of the DMTC is the DRS 220, and the second subframe is the data 230. The data is generally encoded based on orthogonal frequency-division multiplexing (OFDM).

In this aspect of the disclosure, the wireless device 110 adjusts the AGC gain for SCells based on a DRS which is received in a same DMTC as data, as opposed to the previous DMTC. For example, at time T1 the AGC gain adjustment g1 is based on DRS 220-1, and at time T3 the AGC gain adjustment g3 is based on DRS 220-3. For time T2, the LBT procedure fails (i.e., unlicensed spectrum was occupied), and thus no DRS and data for the SCell could be transmitted. In prior LTE systems, such a failure would likely result in at time T3 the DRS from time T2 being expired. This drawback is overcome by adjusting the AGC gain for the SCell at T3 based on the DRS 220-3 received in the same DMTC, that is, at time T3.

FIG. 3 illustrates a flowchart 300 of a method in accordance with the signaling diagram of FIG. 2. At Step 310, the wireless device 110 receives the DRS signal 220 and data 230 of the secondary cell SCell operating in unlicensed spectrum. Then at Step 320 the wireless device 110 adjusts the AGC gain for the SCell based on the DRS 220, which is received in a same measurement timing configuration period as the data.

This aspect of the disclosure, described with respect to FIGS. 2 and 3, provides proper AGC gain and adjustment time (i.e., within one or two OFDM symbols). However, this aspect is feasible only if the AGC again adjustment is for non-initial acquisition, because during the initial acquisition a longer period of time is needed to converge to the AGC gain. Also, the LTE network timing must be sufficiently accurate because timing error between the PCell and the SCell results in more timing required for calculating AGC gain. Further, the wireless device 110 must be powerful enough to calculate AGC gain within a same DMTC as the DRS and data transmission.

FIG. 4 illustrates a signaling diagram 400 in accordance with another aspect of the disclosure. PCell signaling versus time is shown in the top portion of the figure, SCell signaling versus time is shown in the bottom portion.

The aspect of FIGS. 4 and 5 differs from the aspect of FIGS. 2 and 3 in that the wireless device 110 adjusts AGC gain for the SCell based not on the SCell DRS 220/420, but alternatively on the PCell DRS 410.

Some wireless devices 110 are not powerful enough to perform AGC gain adjustment within a same DMTC as a DRS and data is received, as in the aspect discussed above with respect to FIGS. 2 and 3. Also, if a SCell is otherwise occupied, AGC gain adjustment in the SCell cannot be based on the DRS in a previous SCell, as in prior systems.

However, since the PCell and SCell are managed by a same Evolved Node B, it is possible to exchange information between the PCell and SCell. A DRS 410 is transmitted in the PCell. A DRS 420 and data 430 is transmitted in the SCell ideally every DMTC. It is possible to use the PCell DRS 410 to access information to calculate AGC gain adjustment for the SCell by estimating at least one of a transmission power difference, a reception power difference, and a propagation path loss difference between the PCell and the SCell, and then determining the AGC gain for the SCell.

FIG. 5 illustrates a flowchart 500 of a method in accordance with the signaling diagram of FIG. 4.

At Step 510, the wireless device 110 receives a primary DRS 410 from a primary cell operating in licensed spectrum. At Step 520, a LBT operation is performed on the SCell, and at Step 530 it is determined whether or not the LBT operation was successful. A successful operation means that the SCell unlicensed spectrum is not occupied, or in other words, there is no signal received or any received signal is below a given threshold.

The LBT operation may alternatively be performed by the SCell rather than the wireless device 110. In such a case, the SCell does not simply evaluate the received signal strength, but may determine the presence/absence of characteristic signals. If the SCell deems the SCell unlicensed spectrum to be occupied, the SCell cannot send the DRS 410 at time T2, and the handling at wireless device 110 becomes complicated as there is no measurement available for AGC gain from time T2 for the purpose of setting the AGC gain at time T2, and the DRS 410 from time T1 may already be outdated.

If the LBT operation is successful, at Step 540, the wireless device 110 adjusts the AGC gain for the SCell based on the secondary DRS 420 from the SCell. The secondary DRS 420 may be received in a same DMTC as compared with data 430, as discussed above with respect to FIGS. 2 and 3. Alternatively, the secondary DRS 420 may be received in a previous DMTC as compared with the data 430, as in prior LTE systems.

If the LBT operation is not successful, such as at time T2 in FIG. 2, no secondary DRS 420 can be transmitted, and the gain g1 from time T1 may be expired. At Step 550, the AGC gain adjustment at time T3 may instead be based on the primary DRS 410, in addition to: 1) a transmission power difference between the PCell and the SCell; and 2) a propagation path loss difference between the PCell and the SCell. The primary DRS 410-2 may be received in a previous DMTC as compared with data 430-3 received in the SCell, as illustrated in FIG. 4. Alternatively, the primary DRS 410-3 may be received in a same measurement timing configuration period T3 as data received from the SCell.

More specifically, the AGC gain for the SCell operating in unlicensed spectrum is adjusted based on the primary DRS 410, a transmission power difference between the PCell and the SCell, and a propagation path loss difference between the PCell and the SCell. The AGC gain adjustment for the SCell is determined in accordance with the following equation:

AGC_SCell=AGC_PCell+(transmission power diff.+ path loss diff.) (Equation 1)

Alternatively, the AGC gain adjustment for the SCell may be determined based on a difference in received power between the PCell and SCell. This is because a difference received power is caused by a combined effect of transmission power difference and propagation path loss difference.

This aspect of the disclosure impacts the standard (TS36.331) in that the power difference and path loss difference needs to be additionally transmitted. Both the power difference and path loss difference are determined by Radio Resource Control (RRC) signaling. This aspect is advantageous in that it provides proper AGC gain in LTE system with LAA SCells. Also, there is a relatively short AGC convergence time.

FIG. 6 illustrates a schematic diagram of a portion of a receiver 600 of a wireless device 110.

The receiver 600 comprises, for example, tuner 610, gain control amplifier 620, analog-to-digital converter (ADC) 630, demodulator 640, and AGC 650. Tuner 610 is configured to adjust its impedance to improve power transfer of the receiver 600 for a received signal. Gain control amplifier 620 is configured to amplify the gain of the tuned signal. The AGC circuit 650 is configured to measure the digitized signal's power level and adjust the gain of the gain control amplifier 620. ADC 630 is configured to convert the gain controlled signal from analog to digital, and this digitized signal is transmitted to the demodulator 640. The LBT procedure discussed above may be performed by any of the tuner 610, gain control amplifier 620, analog-to-digital converter (ADC) 630, and AGC 650.

Example 1 is a method of Automatic Gain Control (AGC) gain adjustment by a wireless device, the method comprising: receiving a primary reference signal from a primary cell operating in licensed spectrum; determining whether a signal from a secondary cell operating in unlicensed spectrum is received; and if the LBT operation is not successful, adjusting the AGC gain for the secondary cell based on the primary reference signal and at least one of a transmission power difference, a reception power difference, and a propagation path loss difference between the primary cell and the secondary cell.

In Example 2, the subject matter of Example 1, wherein the primary reference signal is received in a same measurement timing configuration period as data received from the secondary cell.

In Example 3, the subject matter of Example 1, wherein the primary reference signal is received in a previous measurement timing configuration period as compared with data received from the secondary cell.

In Example 4, the subject matter of Example 1, further comprising: if the LBT operation is successful, adjusting the AGC gain for the secondary cell based on a secondary reference signal received from of the secondary cell.

In Example 5, the subject matter of Example 4, wherein the secondary reference signal is received in a same measurement timing configuration period as data received from the secondary cell.

In Example 6, the subject matter of Example 4, wherein the secondary reference signal is received in a previous measurement timing configuration period as compared with data received from the secondary cell.

In Example 7, the subject matter of Example 4, wherein the secondary reference signal is received before data is received from the secondary cell.

In Example 8, the subject matter of Example 7, wherein the data is encoded based on orthogonal frequency-division multiplexing (OFDM).

In Example 9, the subject matter of Example 1, wherein the wireless device operates in the licensed and unlicensed spectrums using License Assisted Access (LAA).

In Example 10, the subject matter of Example 1, wherein the transmission power difference and the propagation loss difference are indicated by Radio Resource Control (RRC) signaling.

In Example 11, the subject matter of Example 1, wherein the reference signal is a Discovery Reference Signal (DRS), and the measurement timing configuration period is a DRS Measurement Timing Configuration (DMTC).

In Example 12, the subject matter of Example 1, wherein the wireless device operates in accordance with Long Term Evolution (LTE).

In Example 13, the subject matter of Example 1, wherein the step of determining whether the signal is received from the secondary cell comprises a Listen Before Talk (LBT) operation.

Example 14 is the wireless communication device configured to perform the method of the subject matter of Example 1.

Example 15 is a wireless communication device, comprising: a tuner configured to receive a primary reference signal from a primary cell operating in licensed spectrum; a circuit configured to determine whether a signal from a secondary cell operating in unlicensed spectrum is received; and an automatic gain control (AGC) circuit configured to, if the signal from the secondary cell is not received, adjust the AGC gain for the secondary cell based on the primary reference signal and at least one of a transmission power difference, a reception power difference, and a propagation path loss difference between the primary cell and the secondary cell.

In Example 16, the subject matter of Example 15, wherein if a signal from the secondary cell is received, adjusting the AGC gain for the secondary cell based on a secondary reference signal received from of the secondary cell.

Example 17 is a method of Automatic Gain Control (AGC) gain adjustment by a wireless device, the method comprising: receiving a reference signal and data from of a secondary cell operating in unlicensed spectrum; and adjusting the AGC gain for the secondary cell based on the reference signal, which is received in a same measurement timing configuration period as the data.

In Example 18, the subject matter of Example 17, wherein the wireless device operates in the unlicensed spectrum and in licensed spectrum using License Assisted Access (LAA).

In Example 19, the subject matter of Example 17, wherein the reference signal is a Discovery Reference Signal (DRS), and the measurement timing configuration period is a DRS Measurement Timing Configuration (DMTC).

In Example 20, the subject matter of Example 17, wherein the wireless device operates in accordance with Long Term Evolution (LTE).

In Example 21, the subject matter of Example 17, wherein the reference signal is received before the data.

In Example 22, the subject matter of Example 17, wherein the data is encoded based on orthogonal frequency-division multiplexing (OFDM).

Example 23 is the wireless communication device configured to perform the method of the subject matter of Example 14.

Example 24 is the wireless communication device configured to perform the method of the subject matter of any of Examples 1-12.

Example 25 is the wireless communication device configured to perform the method of the subject matter of any of Examples 17-22.

Example 26 is a method substantially as shown and described.

Example 27 is an apparatus substantially as shown and described.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A method of Automatic Gain Control (AGC) gain adjustment by a wireless device, the method comprising:
   receiving a primary reference signal from a primary cell operating in licensed spectrum;
   determining whether a signal from a secondary cell operating in unlicensed spectrum is received; and
   in response to a determination that the signal from the secondary cell is not received, adjusting the AGC gain for the secondary cell based on the primary reference signal and at least one of a transmission power difference, a reception power difference, and a propagation path loss difference between the primary cell and the secondary cell.

2. The method of claim 1, wherein the primary reference signal is received in a same measurement timing configuration period as data received from the secondary cell.

3. The method of claim 1, wherein the primary reference signal is received in a previous measurement timing configuration period as compared with data received from the secondary cell.

4. The method of claim 1, further comprising:
   if a signal from the secondary cell is received, adjusting the AGC gain for the secondary cell based on a secondary reference signal received from of the secondary cell.

5. The method of claim 4, wherein the secondary reference signal is received in a same measurement timing configuration period as data received from the secondary cell.

6. The method of claim 4, wherein the secondary reference signal is received in a previous measurement timing configuration period as compared with data received from the secondary cell.

7. The method of claim 4, wherein the secondary reference signal is received before data is received from the secondary cell.

8. The method of claim 7, wherein the data is encoded based on orthogonal frequency-division multiplexing (OFDM).

9. The method of claim 1, wherein the wireless device operates in the licensed and unlicensed spectrums using License Assisted Access (LAA).

10. The method of claim 1, wherein the transmission power difference, the reception power difference, and the propagation path loss difference are indicated by Radio Resource Control (RRC) signaling.

11. The method of claim 1, wherein the reference signal is a Discovery Reference Signal (DRS), and the measurement timing configuration period is a DRS Measurement Timing Configuration (DMTC).

12. The method of claim 1, wherein the wireless device operates in accordance with Long Term Evolution (LTE).

13. The method of claim 1, wherein the step of determining whether the signal is received from the secondary cell comprises a Listen Before Talk (LBT) operation.

14. The wireless communication device configured to perform the method of claim 1.

15. A wireless communication device, comprising:
  a tuner configured to receive a primary reference signal from a primary cell operating in licensed spectrum;
  a circuit configured to determine whether a signal from a secondary cell operating in unlicensed spectrum is received; and
  an automatic gain control (AGC) circuit configured to, in response to a determination that the signal from the secondary cell is not received, adjusting the AGC gain for the secondary cell based on the primary reference signal and at least one of a transmission power difference, a reception power difference, and a propagation path loss difference between the primary cell and the secondary cell.

16. The wireless device of claim 15, wherein if a signal from the secondary cell is received, adjusting the AGC gain for the secondary cell based on a secondary reference signal received from of the secondary cell.

* * * * *